(12) United States Patent
Kim et al.

(10) Patent No.: US 10,902,994 B2
(45) Date of Patent: Jan. 26, 2021

(54) COIL ELECTRONIC COMPONENT

(71) Applicant: SAMSUNG ELECTRO-MECHANICS CO., LTD., Suwon-Si (KR)

(72) Inventors: Chi Seong Kim, Suwon-Si (KR); Jun Il Kang, Suwon-Si (KR); Sa Yong Lee, Suwon-Si (KR); Gun Hwi Hyung, Suwon-Si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 167 days.

(21) Appl. No.: 15/988,497

(22) Filed: May 24, 2018

(65) Prior Publication Data
US 2019/0115145 A1    Apr. 18, 2019

(30) Foreign Application Priority Data
Oct. 17, 2017  (KR) .................. 10-2017-0134635

(51) Int. Cl.
*H01F 27/29*   (2006.01)
*H01F 27/28*   (2006.01)
*H01F 41/04*   (2006.01)
*H01F 27/32*   (2006.01)
*H01F 17/00*   (2006.01)
*H05K 1/18*    (2006.01)

(52) U.S. Cl.
CPC ....... *H01F 27/292* (2013.01); *H01F 17/0013* (2013.01); *H01F 27/2804* (2013.01); *H01F 27/32* (2013.01); *H01F 41/041* (2013.01); *H01F 2027/2809* (2013.01); *H05K 1/181* (2013.01); *H05K 2201/1003* (2013.01)

(58) Field of Classification Search
CPC ........... H01F 17/0013; H01F 2017/002; H01F 27/292; H01F 27/2804; H01F 27/32; H01F 27/29; H01F 2027/2809; H01F 41/041; H01K 1/181; H05K 2201/1003
USPC .......................................... 336/200, 192, 223
See application file for complete search history.

(56) References Cited

U.S. PATENT DOCUMENTS

| | | | | |
|---|---|---|---|---|
| 5,117,326 | A  * | 5/1992 | Sano ................... | C04B 35/4684 361/321.4 |
| 7,659,568 | B2 * | 2/2010 | Kusano ................ | H01G 4/2325 257/303 |
| 8,520,361 | B2 * | 8/2013 | Motoki ................. | H01G 4/232 361/301.4 |
| 9,704,640 | B2 * | 7/2017 | Choi ....................... | H01F 17/04 |
| 9,984,805 | B2 * | 5/2018 | Kudo ................... | H01F 17/0013 |

(Continued)

FOREIGN PATENT DOCUMENTS

| | | |
|---|---|---|
| JP | 2009-076719 A | 4/2009 |
| KR | 10-2016-0019266 A | 2/2016 |

*Primary Examiner* — Mang Tin Bik Lian
(74) *Attorney, Agent, or Firm* — Morgan, Lewis & Bockius LLP (57) ABSTRACT

A coil electronic component includes a body including a plurality of insulating layers and coil patterns disposed on the insulating layers, and external electrodes formed on external surfaces of the body and connected to the coil patterns, wherein the external electrodes include first layers being electroless plating layers and second layers formed on the first layers and having a form in which metal particles are dispersed in a polymer base, respectively.

19 Claims, 6 Drawing Sheets

(56) References Cited

U.S. PATENT DOCUMENTS

| | | | | |
|---|---|---|---|---|
| 2005/0083637 | A1* | 4/2005 | Yoshll | H01G 4/2325 361/600 |
| 2008/0123249 | A1* | 5/2008 | Kunishi | H01G 4/2325 361/306.3 |
| 2008/0151470 | A1* | 6/2008 | Motoki | H01G 4/30 361/303 |
| 2008/0239617 | A1* | 10/2008 | Motoki | H01G 4/30 361/301.4 |
| 2009/0303656 | A1* | 12/2009 | Ogawa | H01G 4/005 361/301.4 |
| 2010/0091426 | A1* | 4/2010 | Motoki | H01C 1/148 361/301.4 |
| 2012/0018205 | A1* | 1/2012 | Sato | H01G 4/008 174/260 |
| 2013/0107420 | A1* | 5/2013 | Sakurada | H01G 4/30 361/321.1 |
| 2014/0063683 | A1* | 3/2014 | Gu | H01G 4/30 361/301.4 |
| 2014/0375173 | A1* | 12/2014 | Hamanaka | H01L 41/0472 310/363 |
| 2015/0035640 | A1* | 2/2015 | Wang | H01F 17/0006 336/200 |
| 2015/0115776 | A1* | 4/2015 | Terashita | H01C 7/008 310/365 |
| 2016/0042857 | A1* | 2/2016 | Chun | H01F 27/292 336/200 |
| 2017/0140864 | A1* | 5/2017 | Arai | H01F 1/28 |
| 2018/0090266 | A1* | 3/2018 | Sano | H01F 41/122 |
| 2018/0233272 | A1* | 8/2018 | Araki | H01F 27/29 |

\* cited by examiner

COIL ELECTRONIC COMPONENT

CROSS-REFERENCE TO RELATED APPLICATION(S)

This application claims the benefit of priority to Korean Patent Application No. 10-2017-0134635 filed on Oct. 17, 2017, in the Korean Intellectual Property Office, the disclosure of which is incorporated herein by reference in its entirety.

TECHNICAL FIELD

The present disclosure relates to a coil electronic component.

BACKGROUND

An inductor corresponding to a coil electronic component is a component constituting an electronic circuit, together with a resistor and a capacitor, and is used to remove noise or is used as a component constituting an LC resonant circuit. In this case, the inductor may be variously classified as a multilayer inductor, a winding type inductor, a thin film type inductor, or the like, depending on a form of a coil.

In the multilayer inductor, coil patterns are formed using a conductive paste, or the like, on insulator sheets using a magnetic material as a main material, and the insulator sheets on which the coil patterns are formed are stacked to form a coil in a stacked sintered body, thereby implementing inductance. An external electrode of the multilayer inductor includes a multilayer plating electrode, and an electroplating process is mainly used as a plating process for the multilayer plating electrode. However, in the plating electrode formed by the electroplating process, uniformity of a thickness of the electrode may be low, and there is a risk that a region that is not plated will occur.

SUMMARY

An aspect of the present disclosure may provide a coil electronic component of which electrical characteristics such as a direct current (DC) resistance Rdc are improved by improving uniformity of a thickness of an external electrode.

According to an aspect of the present disclosure, a coil electronic component may include: a body including a plurality of insulating layers and coil patterns disposed on the insulating layers; and external electrodes formed on external surfaces of the body and connected to the coil patterns, wherein the external electrodes include first layers being electroless plating layers and second layers formed on the first layers and having a form in which metal particles are dispersed in a polymer base, respectively.

The electroless plating layer may be a copper (Cu) electroless plating layer.

The metal particles of the second layer may be silver (Ag) particles.

The first and second layers may be in direct contact with each other.

The electroless plating layer may be a Cu electroless plating layer, and the metal particles of the second layer may be Ag particles.

Some Cu components of the Cu electroless plating layer may be substituted with Ag components of the Ag particles.

A content of the metal particles in the second layer may be 15 wt % or less.

An average diameter of the metal particles in the second layer may be 50 nm or less.

A thickness of the first layer may be 5 μm to 15 μm.

A thickness of the second layer may be 0.01 μm to 1.0 μm.

The second layer may be an outermost layer of the external electrode.

The external electrode may have an L shape or a linear shape.

The external electrode may only be formed on one surface of the body.

The body may further include lead portions connecting the coil patterns and the external electrodes to each other.

The first layer may be in direct contact with the lead portion.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will be described in detail with reference to the accompanying drawings. In the accompanying drawings, shapes, sizes, and the like, of components may be exaggerated or stylized for clarity.

The present disclosure may, however, be exemplified in many different forms and should not be construed as being limited to the specific embodiments set forth herein. Rather these embodiments are provided so that this disclosure will be thorough and complete, and will fully convey the scope of the disclosure to those skilled in the art.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the accompanying drawings. For example, a first connection member is disposed on a level above a redistribution layer. However, the claims are not limited thereto. In addition, a vertical direction refers to the above-mentioned upward and downward directions, and a horizontal direction refers to a direction perpendicular to the above-mentioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

Figure 1:
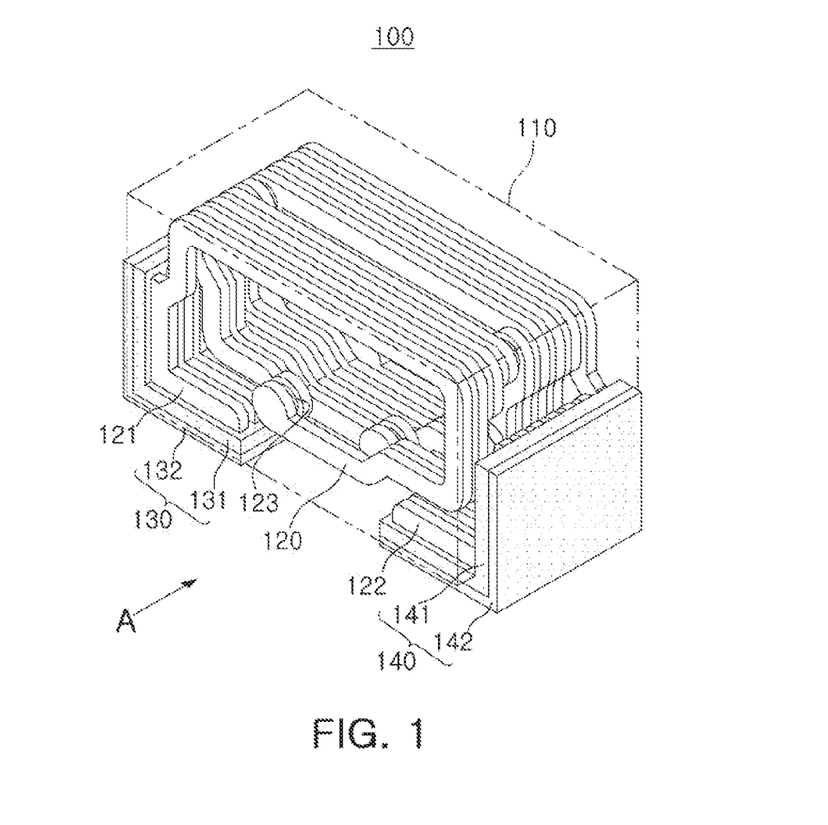
FIG. 1 is a schematic perspective view illustrating a coil electronic component according to an exemplary embodiment in the present disclosure so that internal coil patterns are viewed.
Figure 2:
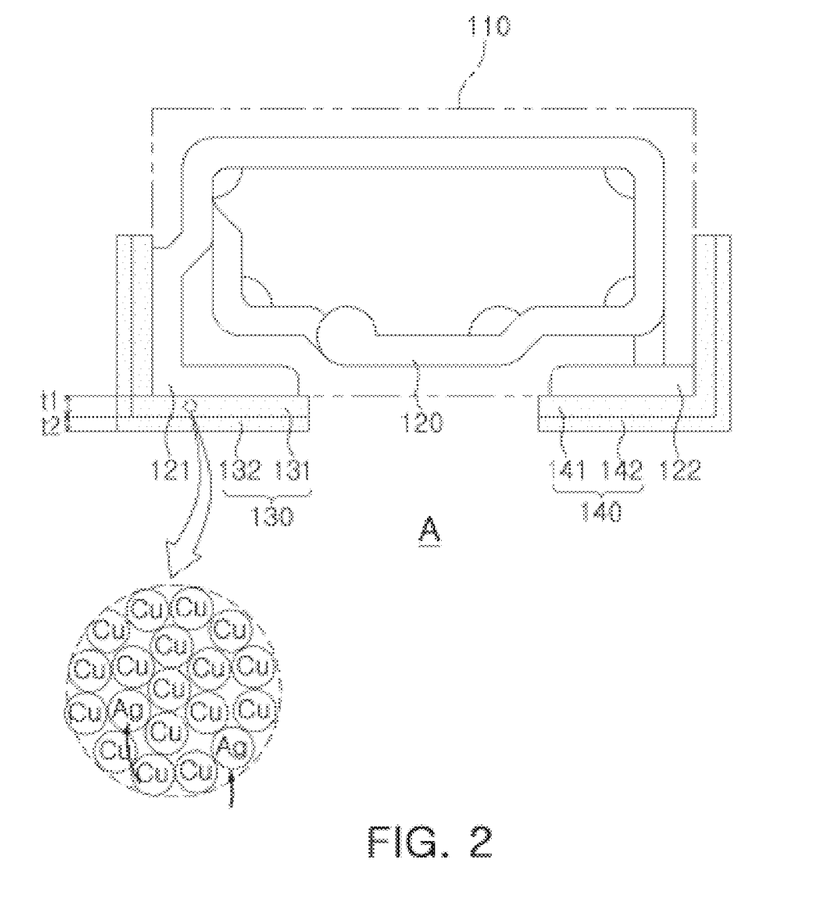
FIG. 2 is a perspective view of the coil electronic component of FIG. 1 when viewed in direction A.
Figure 3:
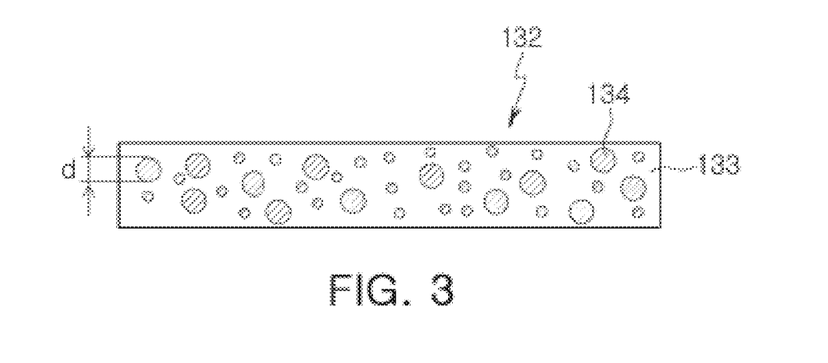
FIG. 3 is a schematic cross-sectional view illustrating a second layer of an external electrode used in the coil electronic component of FIG. 1.

FIG. 1 is a schematic perspective view illustrating a coil electronic component according to an exemplary embodiment in the present disclosure so that internal coil patterns are viewed. FIG. 2 is a perspective view of the coil electronic component of FIG. 1 when viewed in direction A. In addition, FIG. 3 is a schematic cross-sectional view illustrating a second layer of an external electrode used in the coil electronic component of FIG. 1.

Referring to FIGS. 1 and 2, a coil electronic component 100 according to the present exemplary embodiment may include a body 110, coil patterns 120, and external electrodes 130 and 140. The respective components constituting the coil electronic component 100 will hereinafter be described.

Figure 5:
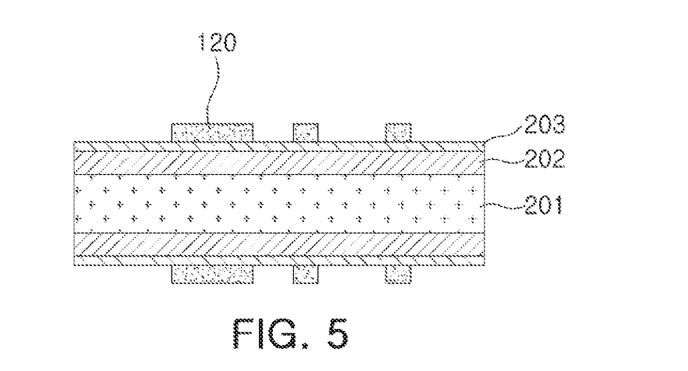

The body 110 may include a plurality of insulating layers 110' (see a description for processes provided elsewhere herein and shown in, e.g., FIG. 5), and the coil patterns 120 disposed on the insulating layers. An appropriate material selected among materials that may be used as a material of one component forming a body of an inductor may be used as a material of the insulating layer constituting the body 110. For example, a resin, ceramic, ferrite, or the like, may be used as the material of the insulating layer. In the present exemplary embodiment, a photosensitive insulating material may be used as the material of the insulating layer of the body 110. Therefore, fine patterns may be implemented by a photolithography process. That is, the insulating layer may be formed of the photosensitive insulating material, and conductive vias 123, the coil patterns 120, and the like, may thus be finely formed to contribute to miniaturization and performance improvement of the coil electronic component 100. To this end, for example, a photosensitive organic material or a photosensitive resin may be included in the insulating layer of the body 110. In addition, an inorganic component such as $SiO_2/Al_2O_3/BaSO_4$/Talc, or the like, may further be included as a filler component in the insulating layer of the body 110.

The coil patterns 120 may form a spiral coil form in a stacking direction. In this case, the coil patterns 120 formed on different levels may be connected to each other by the conductive vias 123. The coil patterns 120 may be obtained by patterning a metal having high conductivity, and may be formed by, for example, a tenting process using copper (Cu) foil etching, a semi-additive process (SAP) using copper plating, a modified semi-additive process (MSAP), or the like. A metal for forming the coil patterns 120 may be copper (Cu), silver (Ag), palladium (Pd), aluminum (Al), nickel (Ni), titanium (Ti), gold (Au), platinum (Pt), or mixtures thereof. The coil patterns 120 may also be formed by a process such as plating, sputtering, or the like, in addition to such a patterning manner.

Meanwhile, the body 110 may include lead portions 121 and 122 connecting the coil patterns 120 and the external electrodes 130 and 140 to each other. In the present exemplary embodiment, the lead portions 121 and 122 may be exposed to a lower surface of the body 110 in a form illustrated in FIGS. 1 and 2, and may be connected to the external electrodes 130 and 140, respectively. In addition, as illustrated in FIGS. 1 and 2, the coil patterns 120 may be disposed in a direction perpendicular to a mounting direction of the coil electronic component 100.

The conductive vias 123 may connect the coil patterns 120 disposed on different layers to each other. The conductive vias 123 may be formed of a plating layer, and may be formed by, for example, copper (Cu) plating. In addition, the conductive vias 123 may include bump structures formed of tin (Sn), or the like, in order to further enhance interlayer connectivity.

The external electrodes 130 and 140 may be formed on external surfaces of the body, may be configured as a pair, and may be disposed to face each other. As illustrated in FIG. 1, the external electrodes 130 and 140 may have an L shape, and may only be formed on the lower surface and end surfaces of the body 110. Since the external electrodes 130 and 140 have the L shape, the coil patterns 120 may be disposed perpendicularly to the mounting direction. However, as illustrated in a modified example of FIG. 12, the external electrodes 130 and 140 may also only be formed on one surface of the body 110 (a lower surface of the body in FIG. 12) to have a linear shape.

In the present exemplary embodiment, the external electrodes 130 and 140 may have a multilayer structure. In more detail, the external electrodes 130 and 140 may include first layers 131 and 141 and second layers 132 and 142, respectively. Here, the first layers 131 and 141 may be electroless plating layers, and the second layers 132 and 142 may have a form in which metal particles are dispersed in a polymer base.

The first layers 131 and 141, which are layers of the external electrodes 130 and 140 most adjacent to the coil patterns 120 and the body 110, may be formed to be in direct contact with the lead portions 121 and 122. In the related art, the first layers 131 and 141 described above are generally formed by electroplating. However, when the electrode is formed by the electroplating, it is difficult to secure uniformity of a thickness of the electrode, and a region that is not plated is generated. In order to solve these problems, the first layers 131 and 141 may be formed as electroless plating layers such as copper (Cu) electroless plating layers in the present exemplary embodiment. Each of the first layers 131 and 141 may be formed at a thickness greater than that of each of the second layers 132 and 142, and a thickness t1 of each of the first layers 131 and 141 may be in a range from about 5 μm to about 15 μm. When the first layers 131 and 141 are formed as the electroless plating layers, uniformity of a thickness of each of the first layers 131 and 141 may be improved, and according to an experiment of the present inventors, when an average thickness of each of the first layers 131 and 141 is about 10 µm, a thickness deviation thereof was about 0.5 µm or less. Such a result indicates that the thickness deviation is significantly decreased as compared to a thickness deviation (about 1.5 µm) when an electroplating layer is formed under the same condition, and uniformity of a thickness of each of the external electrodes 130 and 140 may be improved, such that electrical characteristics such as a direct current resistance (Rdc) may be improved.

Referring to FIG. 3, the second layers 132 and 142 may have a form in which metal particles 134 are dispersed in a polymer base 133, and may be used in order to substitute for Ni or Sn plating layers that are used in the related art. Since the second layers 132 and 142 substitute for the Ni and Sn plating layers, the second layers 132 and 142 may be the outermost layers of the external electrodes 130 and 140. This means that additional external electrodes covering the second layers 132 and 142 are not used.

The polymer base 133 may cover the first layers 131 and 141 to protect the first layers 131 and 141, and may be formed of any material that may perform a protection function. For example, the polymer base 133 may be formed of a material such as polyethylene, polyacetylene, polypyrrole, or the like. In addition, the polymer base 133 may be melted or be separated from the coil electronic component 100 by a soldering process when the coil electronic component 100 is mounted on a board, or the like. Each of the second layers 132 and 142 may be formed at a thickness smaller than that of each of the first layers 131 and 141, and a thickness t2 of each of the second layers 132 and 142 may be in a range from about 0.01 µm to about 1.0 µm. This thickness may be very small compared to the thickness (several micrometers) of each of the Ni and Sn plating layers used in the related art, and the second layers 132 and 142 may be used as polymer electrodes, which may be advantageous in miniaturization of the coil electronic component 100. In addition, when the second layers 132 and 142 have the polymer base 133, uniformity of a thickness of each of the second layers 132 and 142 may be high, as in the first layers 131 and 141, and according to an experiment of the present inventors, when an average thickness of each of the second layers 132 and 142 is about 0.5 µm, a thickness deviation thereof was about 0.2 µm or less.

The metal particles 134 may impart conductivity to the second layers 132 and 142, and may be, for example, silver (Ag) particles. A content of the metal particles 134 may be controlled in consideration of a function of the metal particles 134, and a content of the metal particles 134 in the second layers 132 and 142 may be about 15 wt % or less. In addition, nano-sized particles may be used as the metal particles 134, and an average diameter d of the metal particles 134 may be about 50 nm or less.

Meanwhile, the second layers 132 and 142 may be formed on surfaces of the first layers 131 and 141, respectively, by a process of immersing the coil electronic component 100 in a polymer solution in which the metal particles are dispersed. When the second layers 132 and 142 are formed by the process described above, the first layers 131 and 141 and the second layers 132 and 142 may be in direct contact with each other, respectively. In addition, when the first layers 131 and 141 are formed as the Cu electroless plating layers and the metal particles 134 are formed of Ag, some Cu components of the Cu electroless plating layers may be substituted with Ag components of the Ag particles in a process of forming the second layers 132 and 142, and the second layers 132 and 142 may be effectively formed by such a reaction.

An example of a method of manufacturing the coil electronic component having the structure described above will hereinafter be described with reference to FIGS. 4 through 11. A structural feature of the coil electronic component may be more apparent from a description for a method of manufacturing the coil electronic component to be provided below.

As described above, the coil electronic component described above may be manufactured by collectively stacking a plurality of unit laminates to be matched to one another. As an example, a unit laminate including an insulating layer 111', a coil pattern 120, a conductive via 123, and the like, may be manufactured.

Figure 4:
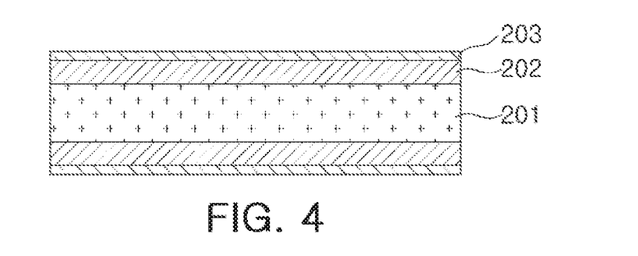
FIGS. 4 through 11 are cross-sectional views at various stages in a method of manufacturing a coil electronic component according to an exemplary embodiment in the present disclosure.

First, as illustrated in FIG. 4, a carrier layer 201 may be prepared. The carrier layer 201 may be formed of a thermosetting resin, and copper foil layers 202 and 203 may be formed on a surface of the carrier layer 201. Therefore, the carrier layer 201 may be provided in a form of a copper clad laminate. The copper foil layers 202 and 203 may serve as seed layers for forming the coil patterns 120 or serve to easily separate the carrier layer 201 in a subsequent process, and may be omitted according to another exemplary embodiment.

Then, as illustrated in FIG. 5, the coil patterns 120 may be formed on the carrier layer 201. In this case, the lead portions 121 and 122 having the form described above may also be formed. In this case, the coil patterns 120 may be formed on both of upper and lower surfaces of the carrier layer 201 in order to increase process efficiency. The coil patterns 120 may be obtained by stacking a mask layer on the copper foil layer 203, patterning the mask layer, and then plating Cu, or the like. Then, the mask layer may be removed.

Figure 6:
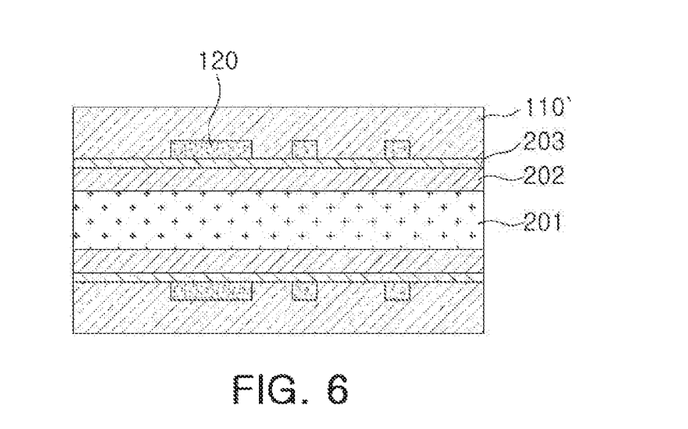

Then, as illustrated in FIG. 6, the insulating layer 110' covering the coil patterns 120 may be formed. As described above, the insulating layer 110' may be obtained using the photosensitive insulating material, and may be applied using, for example, a vacuum laminator. In this case, the insulating layer 110' may have a thickness in a range from about 10 µm to about 80 µm, and may contain a metal or a ceramic filler depending on a required object. In addition, a hardening level of the insulating layer 110' may be controlled by an amount of the photosensitive material included in the insulating layer 110', and the insulating layer may be formed of a mixture of two kinds of materials such as a mixture of a thermosetting material and a photosensitive material.

Figure 7:
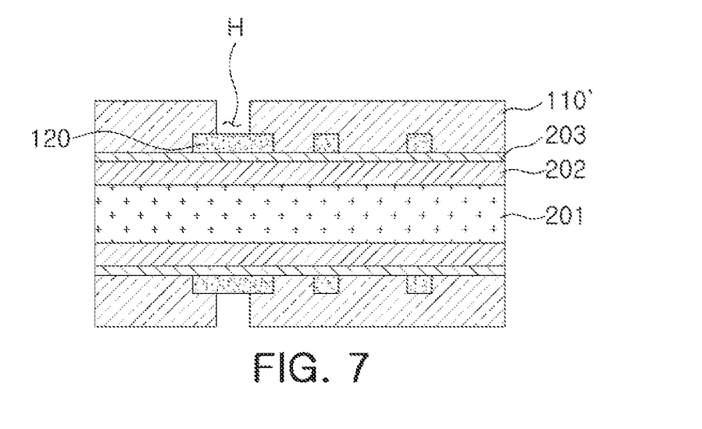
Figure 8:
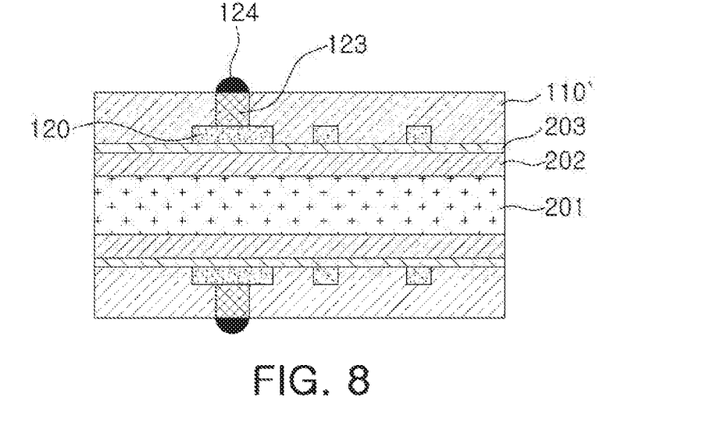

Then, as illustrated in FIGS. 7 and 8, the conductive via 123 connected to the coil pattern 120 may be formed. To this end, a though-hole H may be formed by exposing and developing the insulating resin 110' formed of the photosensitive insulating material after exposure to ultraviolet (UV) radiation, or the like, and a material for forming the conductive via 123, for example, a Cu plating layer may be formed to fill the through-hole H. In addition, a bump structure 124 formed of tin (Sn), or the like, may be formed on the conductive via 123 in order to improve interlayer connectivity.

Figure 9:
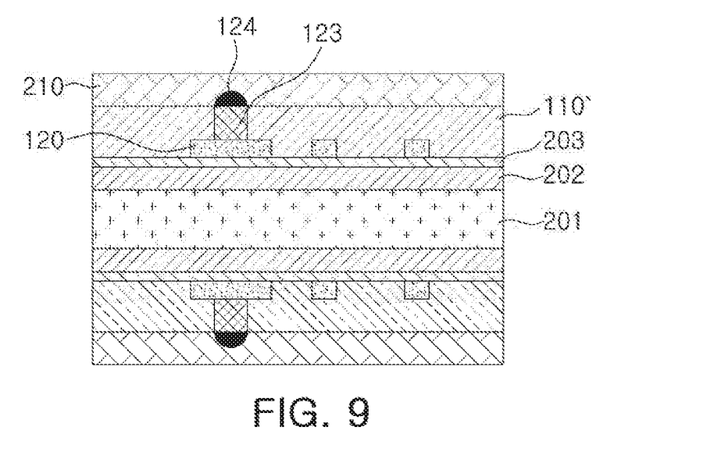
Figure 10:
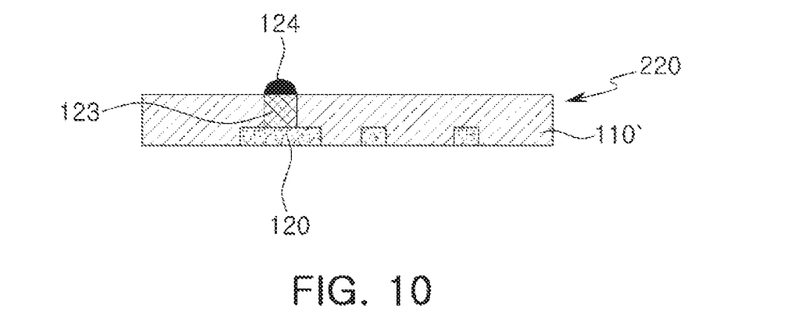

Then, as illustrated in FIG. 9, a protective film 210 covering the insulating layer 110', the coil pattern 120, and the conductive via 123 may be formed. However, the present process may not be performed in some cases. In addition, the insulating layer 110', the coil pattern 120, the conductive via 123, and the like, obtained in the previous process may be separated from the carrier layer 201 to obtain a unit laminate 220 as illustrated in FIG. 10. In this case, when the copper foil layers 202 and 203 remain on the insulating layer 110', the coil patterns 120, and the like, the remaining copper foil layers 202 and 203 may be removed by appropriately applying a suitable etching process.

Figure 11:
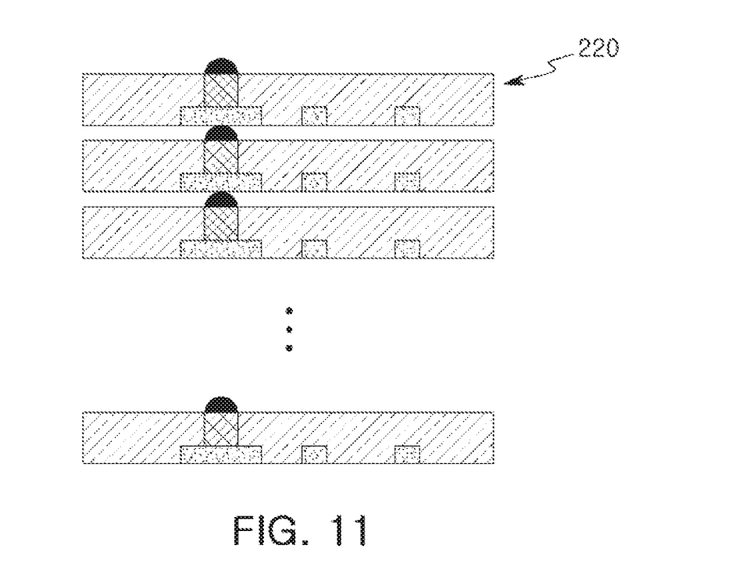

A plurality of unit laminates 220 that are obtained as described above may be prepared, and may be stacked to be matched to one another as illustrated in FIG. 11. The plurality of unit laminates 220 may be collectively stacked. In this case, a stacked structure may be obtained by applying heat and pressure to the stacked laminates. In addition, a dicing process of dicing the stacked structure into each unit chip may be performed, if necessary. In the stacked structure obtained as described above, interlayer coupling may be stably implemented without performing a firing process. As in the present exemplary embodiment, the unit laminates 220 manufactured in advance may be stacked at a time to form a body, resulting in a reduction in the number of processes and a process time as compared to a method of sequentially stacking the respective layers, which leads to a reduction in a process cost. In addition, the method of manufacturing the coil electronic component according to the present exemplary embodiment may be advantageous in effectively implementing specifications such as a size, electrical characteristics, and the like, of the coil electronic component 100 by appropriately controlling the number or thicknesses of coil patterns 120. The plurality of unit laminates 220 is stacked at a time in the present exemplary embodiment, but the plurality of unit laminates 220 may also be stacked two or more times depending on the number of unit laminates.

Figure 12:
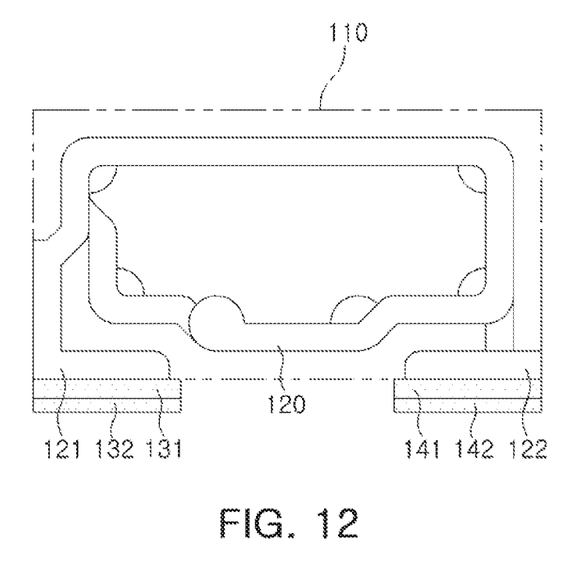
FIG. 12 is a perspective view illustrating a coil electronic component according to a modified embodiment.

After the unit laminates 220 are stacked, the external electrodes 130 and 140 connected to the coil patterns 120 may be formed to obtain the structure as illustrated in FIG. 12. As described above, the first layers 131 and 141 of the external electrodes 130 and 140 may be formed by electroless plating of Cu, or the like, in order to secure the uniformity of the thickness thereof. In addition, the second layers 132 and 142 may be formed using the polymer solution including the metal particles, and may thus be obtained in a form in which the metal particles are dispersed in the polymer base.

As set forth above, when the coil electronic component according to the exemplary embodiment in the present disclosure is used, the uniformity of the thickness of each of the external electrodes may be improved, such that electrical characteristics such as the DC resistance (Rdc) of the coil electronic component may be improved, and such a coil electronic component may be effectively manufactured by a collective stacking method, or the like.

While exemplary embodiments have been shown and described above, it will be apparent to those skilled in the art that modifications and variations could be made without departing from the scope of the present invention as defined by the appended claims.

What is claimed is:
1. A coil electronic component comprising:
a body including a plurality of insulating layers and coil patterns disposed on the insulating layers; and
external electrodes formed on external surfaces of the body and connected to the coil patterns,
wherein each of the external electrodes include a first electroless plating layer and a second layer disposed on the first electroless plating layer, the second layer comprising metal particles dispersed in a polymer base,
wherein a thickness of each of the first electroless plating layers is in a range from 5 μm to 15 μm with a thickness deviation of less than 0.5 μm.

2. The coil electronic component of claim 1, wherein each of the first electroless plating layer is a copper (Cu) electroless plating layer.

3. The coil electronic component of claim 1, wherein the metal particles of each of the second layer are silver (Ag) particles.

4. The coil electronic component of claim 1, wherein each first electroless plating layer is in direct contact with a corresponding second layer.

5. The coil electronic component of claim 4, wherein each of the first electroless plating layers is a Cu electroless plating layer, and the metal particles of each of the second layers are Ag particles.

6. The coil electronic component of claim 5, wherein some Cu components of the Cu electroless plating layer are substituted with Ag components of the Ag particles.

7. The coil electronic component of claim 1, wherein a content of the metal particles in each of the second layers is 15 wt % or less.

8. A coil electronic component comprising:
a body including a plurality of insulating layers and coil patterns disposed on the insulating layers; and
external electrodes formed on external surfaces of the body and connected to the coil patterns,
wherein each of the external electrodes include a first electroless plating layer and a second layer disposed on the first electroless plating layer, the second layer comprising metal particles dispersed in a polymer base,
wherein a thickness of each of the first electroless plating layers is in a range from 5 μm to 15 μm, and
wherein an average diameter of the metal particles in the second layer is 50 nm or less.

9. The coil electronic component of claim 1, wherein a thickness of each of the second layers is in a range from 0.01 μm to 1.0 μm, and a thickness deviation of less than 0.2 μm.

10. The coil electronic component of claim 1, wherein each of the second layers is an outermost layer of a corresponding external electrode.

11. The coil electronic component of claim 1, wherein each of the external electrodes has an L shape or a linear shape.

12. The coil electronic component of claim 1, wherein each of the external electrodes is only formed on one surface of the body.

13. The coil electronic component of claim 1, wherein the body further includes lead portions connecting ends of the coil patterns and corresponding external electrodes to each other.

14. The coil electronic component of claim 13, wherein each of the first electroless plating layers is in direct contact with the lead portion.

15. A coil electronic component comprising:
a body comprising insulating layers, each having a coil pattern disposed thereon; and
external electrodes disposed on external surfaces of the body and connecting to corresponding ends of the coil patterns, each of the external electrodes comprising a first plating layer and a second layer comprising a polymer and metal particles,
wherein the first plating layer has a thickness deviation of less than 0.5 μm,
wherein an average diameter of the metal particles in the second layer is 50 nm or less, and wherein a thickness of the second layer is in a range from 0.01 μm to 1.0 μm.

16. The coil electronic component of claim 15, wherein a deviation in thickness of the first plating layer is 5% or less of an average thickness of the first plating layer.

17. The coil electronic component of claim 15, wherein adjacent coil patterns are electrically connected using conducting vias penetrating through a corresponding insulating layer, the vias comprising bump structures.

18. The coil electronic component of claim 15, wherein a content of the metal particles in the second layer is 15 wt % or less.

19. The coil electronic component of claim 15, wherein the polymer of the second layer is selected to have a melting point such that the polymer melts during a soldering process performed when mounting the coil electronic component on a board.

* * * * *